United States Patent [19]
Jung

[11] Patent Number: 5,845,978
[45] Date of Patent: Dec. 8, 1998

[54] HANDLE APPARATUS FOR A COMPUTER

[75] Inventor: Hae-Soo Jung, Suwon, DPR of Korea

[73] Assignee: SamSung Electronics Co., Ltd., Suwon, DPR of Korea

[21] Appl. No.: 598,912

[22] Filed: Feb. 9, 1996

[30] Foreign Application Priority Data

Feb. 10, 1995 [KP] DPR of Korea ..................... 1995-2115

[51] Int. Cl.$^6$ .................................................. A47B 95/02
[52] U.S. Cl. .......................... 312/244; 220/759; 220/761; 16/112; 16/DIG. 24; 312/223.2
[58] Field of Search ................................ 312/244, 223.2, 312/223.1, 902; 220/759, 761, 775, 776; 16/112, DIG. 24; 190/115, 116; 222/465.1, 467

[56] References Cited

U.S. PATENT DOCUMENTS

| | | | |
|---|---|---|---|
| 2,419,587 | 4/1947 | Parks | 312/244 X |
| 3,401,827 | 9/1968 | Messina | 220/761 X |
| 3,680,939 | 8/1972 | Peets | 312/244 X |
| 4,033,473 | 7/1977 | Raley et al. | 220/761 X |
| 4,544,050 | 10/1985 | Seynhaeve | 190/115 |
| 4,589,162 | 5/1986 | Manz et al. | |
| 4,661,921 | 4/1987 | Barnes | |
| 4,713,860 | 12/1987 | Mobley et al. | 16/112 X |
| 5,012,553 | 5/1991 | Hardigg et al. | |
| 5,238,142 | 8/1993 | Hanna et al. | 312/244 X |
| 5,293,300 | 3/1994 | Leung | |

*Primary Examiner*—Peter M. Cuomo
*Assistant Examiner*—Janct M. Wilkens
*Attorney, Agent, or Firm*—Robert E. Bushnell, Esq.

[57] ABSTRACT

A handle apparatus for a computer is disclosed, including a chassis forming a framework for receiving various components of a computer and having two pairs of vertically extended tabs each having a support hole for engaging with a shaft, a stop rib for preventing the shaft from being inserted past a predetermined point, a holder rib for preventing the shaft from coming loose, a handle for gripping to facilitate carrying the computer, a pair of shafts for engaging the chassis and the handle in an assembled arrangement, and a cover for covering the chassis, the cover having a groove in which the handle is laid out of sight. The support hole contact area is large in order to disperse the load of the computer efficiently through the center of the shaft, when a worker carries the computer, to prevent the shaft from being transformed. A rest is provided in the groove of the cover to stop the handle's fall thereby preventing the handle from colliding directly with the cover or the chassis of the computer. The handle is covered with a rubber molding to facilitate a user's grip when carrying the computer.

18 Claims, 5 Drawing Sheets

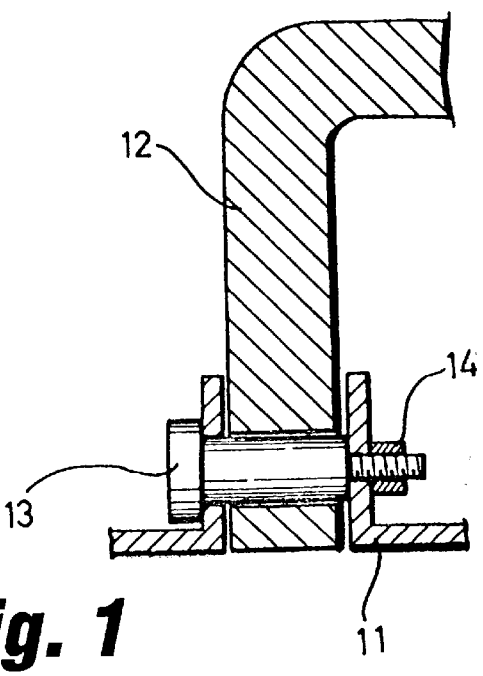
Fig. 1
Prior Art
Fig. 3
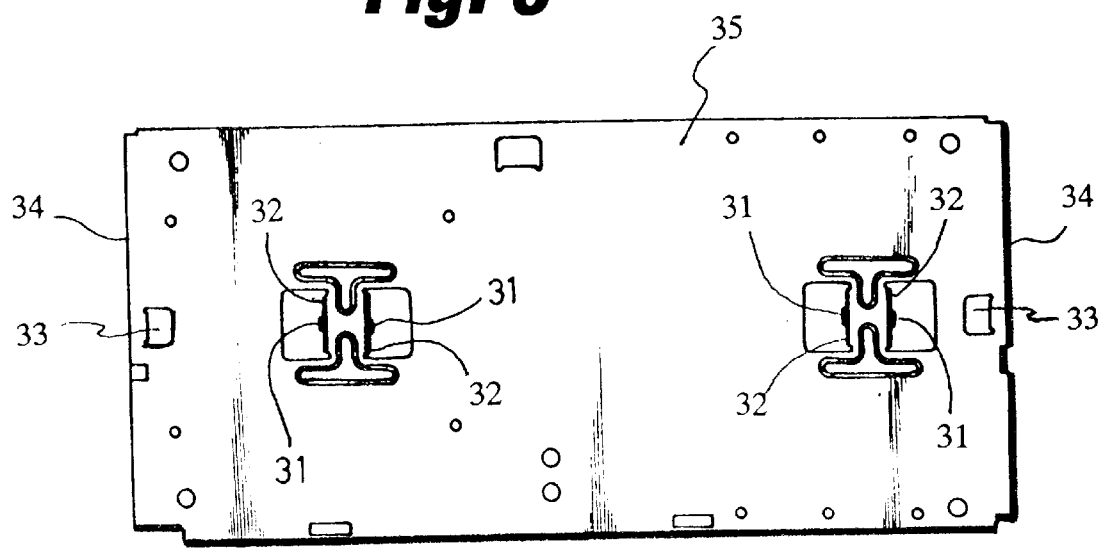

HANDLE APPARATUS FOR A COMPUTER

CROSS REFERENCE TO RELATED APPLICATIONS

This application makes reference to, incorporates the same herein, and claims all benefits accruing under 35 U.S.C §119 from an application entitled *Handling Apparatus For Computer* earlier filed in the Korean Industrial Property Office on 10 Feb. 1995, which was duly assigned Serial No. 95-2115 by that Office.

BACKGROUND OF THE INVENTION

1. Field of the Invention

The present invention relates to a handle apparatus for a computer. More particularly, the present invention relates to a computer chassis having a handle releasably attached thereto and a chassis cover having a recess for stowing away the handle. Further, the present invention relates to a computer chassis having a carrying or lifting handle attached to the chassis by a pair of shafts, and a cover for the computer wherein the cover secures the shafts to the computer chassis.

2. Description of the Prior Art

The use of handles for lifting a carrying electrical equipment is found in Manz et al. U.S. Pat. No. 4,589,162, a *Carrying Handle Device For An Electrical Equipment Enclosure With Handle Stored Flush With The Enclosure Wall And Swung Up For Carrying* which uses a pair of quarter circle arms that pivot from an extended position to a rest position within the enclosure, and a handle attached to the arms. Barnes, U.S. Pat. No. 4,661,921, an *Adapter For Simultaneous Use Of Logic Analyzer And In Circuit Emulator* showing a pivotable handle used for supporting or carrying an electronic analyzer/emulator. Hardigg et al., in U.S. Pat. No. 5,012,553, proposes a *Lightweight Handle* for lifting and transporting a heavy-duty plastic container. The handle can be pivoted about a pair of pivot pins attaching the handle to a pair of support brackets attached to the container from a storage position within a recess of a storage well to a carrying position,.

Portable personal computers or notebook computers have been known to have handles to facilitate their transportation. Leung for example, discloses, in U.S. Pat. No. 5,293,300 a *Portable Computer With A Detachable Handle Including A Battery,* a handle that is rotatable to allow the handle to be used to support the computer at an inclined position and to allow the handle to be used for carrying the computer. For personal computers either not known as a portable type or inconvenient to frequently move because of weight or volume such as a desk top computer or a tower computer, there is a trend of attaching a handle to a main body for lifting and carrying convenience. I have found that conventional handles are inconvenient because a tool is needed to assemble or disassemble instal or remove a threaded fastener coupling that handle to the body of the computer, the requirement for the threaded fastener raises production expenses, and that the cutting process for forming the threaded portion with a predetermined length is very complicated and thus requires large production costs. I have also found that because the size of the contact region between the exterior mounted on the computer and the threaded portion of the threaded fastener is so small, stress is centered on the threaded portion. Accordingly, the threaded portion deleteriously deformed, thus reducing the life of the threaded fastener. Moreover, because the handle is often made of metal, it may cause a pain to the human hand gripping the handle. Furthermore, I have noticed that when a user releases this type of handle after gripping it, the handle is dropped freely, thereby downwardly striking the exterior part of the computer, and causing loud noise and undesired vibration of internal components of the computer. Additionally, because the handle is attached to the exterior body of the computer, it protrudes from the surface of the computer in an unsightly manner.

SUMMARY OF THE INVENTION

It is therefore an object of the present invention to provide an improved computer housing and an improved handle for carrying the computer.

It is another object to provide a handle for a computer that can be assembled and disassembled by a simple engaging method, without reliance upon threaded fasteners.

It is still another object to provide a handle assembly with an increased area of attachment in contact with the chassis in order to enhance support and safety when carrying the computer.

It is yet an object to provide a handle having a molded rubber covering, thereby facilitating ease and comfort when gripped.

It is still yet another a further object of the present invention to provide a chassis cover having a recess receiving the handle and providing flush surface or subsurface storage of the handle.

It is a further object to employ a rest in the recess of the cover to brake the handle's fall and thereby preventing the handle from colliding with the chassis or the chassis cover, when the handle is manually released.

These and other objects may be achieved with a chassis forming a framework for receiving various components of a computer and having two pairs of vertically extended tabs each having a support hole for engaging with a shaft, a stop rib for preventing the shaft from being inserted past a predetermined point, and a rib for preventing the shaft from coming loose. A handle is provided for gripping to facilitate carrying the computer, a pair of shafts engages the chassis and the handle in an assembled arrangement, while a housing covers the chassis. The cover has a groove in which the handle may be received and laid out of sight. The contact area of the support hole is large in order to disperse the load of the computer efficiently through the center of the shaft, when a worker carries the computer, to prevent the shaft from being deformed. A rest is provided in the groove of the cover to stop the handle's fall, thus preventing the handle from colliding directly with the cover or the chassis of the computer. The handle may be covered with a rubber molding to facilitate a user's grip when carrying the computer.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIG. 1 is a sectional configuration view of a handle attached to a conventional computer;

FIG. 3 is a detailed plan top view of a chassis for a computer constructed according to the principles of the invention;

DETAILED DESCRIPTION OF THE PREFERRED EMBODIMENTS

In the following detailed description, many specific details are set forth to provide a more through understanding of the present invention. It will be apparent however, to those skilled in the art, that the present invention may be practiced without these specific details. In other instances, well known circuits have not been described so as not to obscure the present invention.

As illustrated in FIG. 1, a configuration of a handle assembly attached to a conventional computer comprises an exterior part 11 of the computer, a metal handle 12 to be gripped by a user in case of carrying the computer, a shoulder screw 13 to engage the computer with handle 12, and a nut 14 connected to shoulder screw 13. This handle assembly is inconvenient to use because a tool is required to assembly and disassemble because handle 12 is attached using a shoulder screw, nut 14 is an absolute necessity, thereby raising production expenses. Third, the cutting process for forming the threaded portion of shoulder screw 13 so that the shoulder portion is of a predetermined length is very complicated, and thus requires large production costs and fourth, because the size of the contact region between the exterior part 11 and the threaded portion of shoulder screw 13 is so small, stress is centered on the threaded portion.

Accordingly, the threaded portion of shoulder screw 13 may be transformed thus reducing the life of shoulder screw 13. Fifth, handle 12 is made of metal, it may cause pain in the hand gripping the handle; and sixth, when a user releases handle 12 after griping it, handle 12 is dropped freely downward striking the exterior part of the computer, thereby causing serious noise and undesired vibrations of internal components of the computer. Seventh, because the handle is attached to the exterior body of the computer, it protrudes from the surface of the computer in an unsightly manner.

Figure 2:
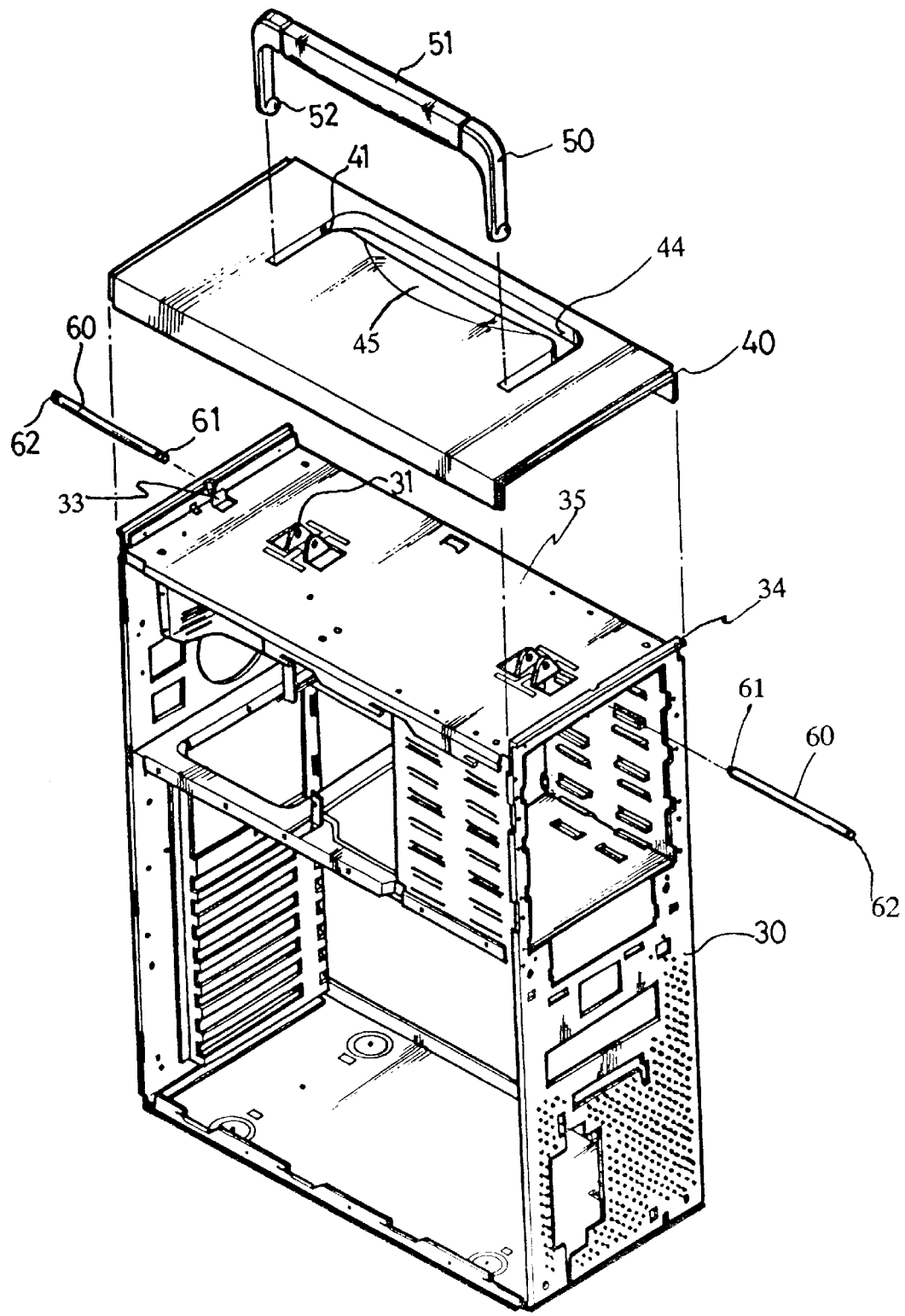
FIG. 2 is an exploded view of a chassis, handle apparatus and cover for a computer constructed according to the principles of the invention.

Referring now to FIG. 2, there is shown, in an exploded view, a chassis 30 for receiving computer components, a top portion 35 of chassis 30, a cover 40 and a handle 50. Handle 50 is coated with a rubber molding and has a U shape, wherein each end of handle 50 has a mounting hole 52. Cover 40 has a grooved 44 therein wherein groove 44 has the same general shape as handle 50. Groove 44 is formed allow handle 50 to be laid therein, when not in use, so that no portion of handle 50 extends above a top surface portion of cover 40. Also shown is a rest 41 within groove 44 the function of which will be discussed later with respect to FIG. 8. A bevel 45, which may be concave in shape, is provided in cover 40 to allow for easy access to handle 50 when it is desired to extract handle 50 from groove 44. Top portion 35 of chassis 30 has a pair of openings 33 through flanges 34, and two pairs of tabs 32 disposed near openings 33. Each tab 32 has a support hole 31 therein. Note that tabs 32 are vertical extensions of the material forming the top portion of chassis 30. Also shown are a pair of shafts 60 for securing handle 50 to chassis 30, wherein each shaft 60 has a first grooved end 61 and a second grooved end 62. Note that cover 40, as shown, covers the top most portion of chassis 30, however, it should be understood that cover 40 could also be formed to with extended sides which would enclose the top and larger side portions of chassis 30.

Referring now to FIG. 3, a top portion 35 of chassis 30 is shown which has a pair of openings 33 through flanges 34 on opposite ends of top portion 35 of chassis 30, and two pairs of tabs 32 disposed near openings 33. Each tab 32 has a support hole 31 therein.

Figure 4:
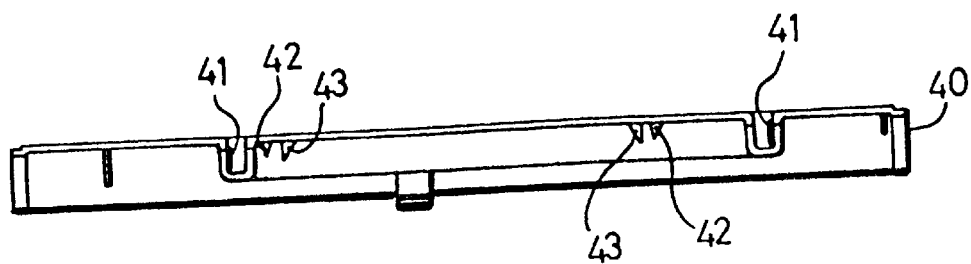
FIG. 4 is a detailed configuration view of a cover for the top portion of the chassis, shown in FIG. 2, of a computer constructed according to the principles of the invention.

Cover 40, as shown in FIG. 4, has a pair of rests 41 within groove 44. Also shown are holder ribs 42 and stop ribs 43, discussed further with respect to FIG. 7, which extend vertically downward from upper inner surface of cover 40.

Figure 5:
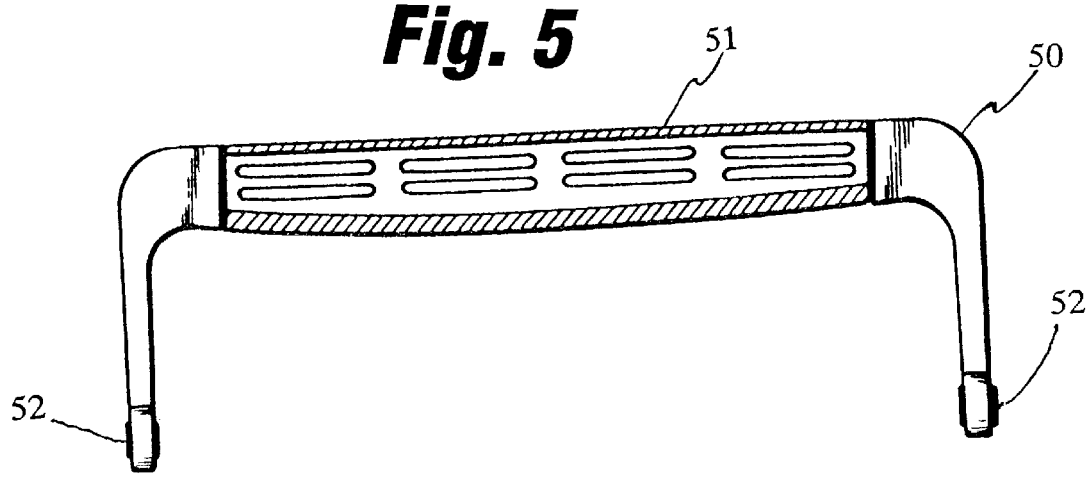
FIG. 5 is a detailed configuration view of a handle for a computer constructed according to the principles of the invention.

A detailed view of the general shape of handle 50 is shown in FIG. 5. Handle 50 is covered by a rubber molding 51 which fits comfortably in a hand for ease in gripping the handle when lifting the computer. Mounting holes 52 through each end of handle 50 allow the handle to be secured to the chassis and to be easily rotated from a stored position to a carrying position and back to the stored position.

Figure 6:
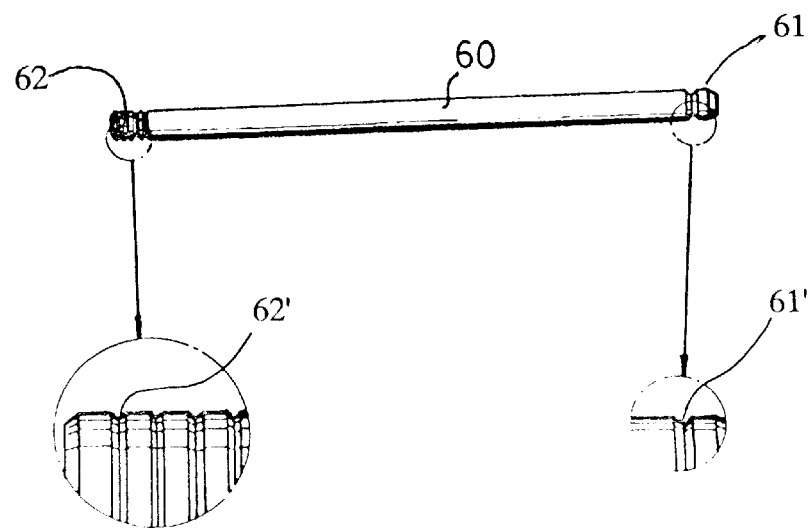
FIG. 6 is a detailed configuration view of a shaft for securing a handle to a computer constructed according to the principles of the invention.

A detailed view of the general shape of each shaft 60 is shown in FIG. 6. Grooved end 61 of shaft 60 has a single groove 61' therein and is positioned to abut stop rib 43 and holder rib 42, whereas grooved end 62 has a plurality of handler grooves 62' therein which allow for easy handling of shaft 60 when inserting or removing the shaft.

Figure 7:
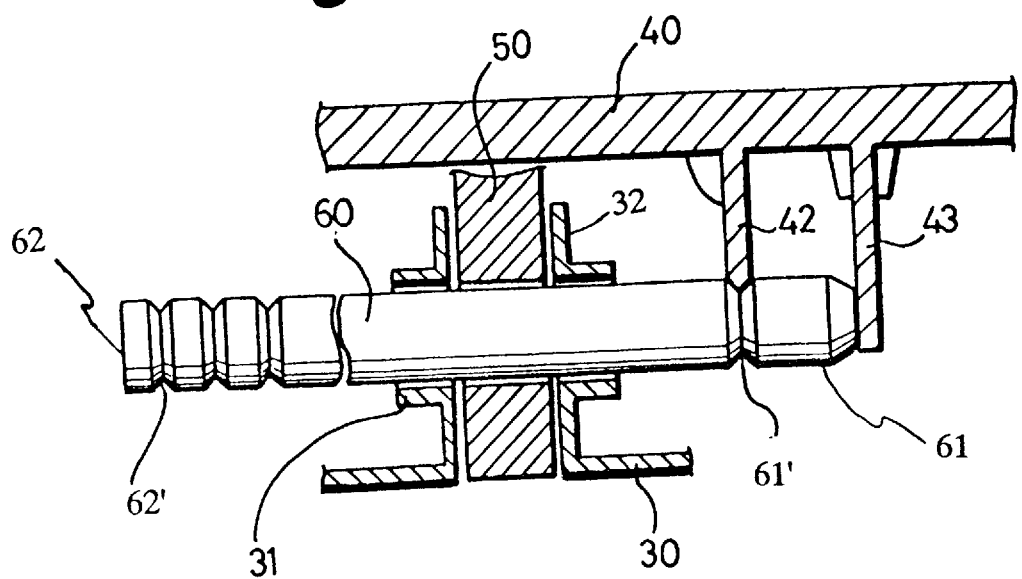
FIG. 7 is a sectional view illustrating the attached arrangement of a handle apparatus for a computer constructed according to the principles of the invention.

Referring now to FIG. 7, a sectional view showing assembly of various components of the handle apparatus according to the principles of the present invention is shown. Handle 50 is inserted through cover 40. Holes 52 in each end of handle 50 are aligned with holes 31 in tabs 32. Shaft 60 is inserted through holes 31 and 52 until grooved end 61 is stopped by stop rib 43. At this time holder rib 42 mates with groove 61' in grooved end 61 thus holding shaft 60 in a desired position and preventing shaft 60 from accidentally falling out this position, thereby stably engaging chassis 30 and handle 50.

Figure 8:
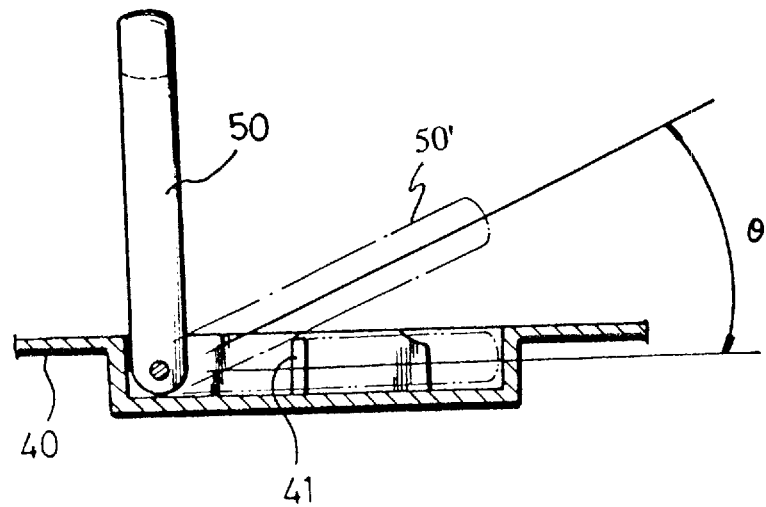
FIG. 8 is a sectional configuration view illustrating a status of the falling handle, of the handle apparatus, being stopped by a rest.

As shown in FIG. 8, handle 50 will be raised to an upright position when it is desired to lift the computer. When handle 50 is released it will fall towards the stored position until it meets rests 41 within groove 44 of cover 40. This position of the handle is shown by dotted outline 50' and angle θ. At this time, handle 50 can be forced into groove 44 with a minimum of pressure required only to overcome the small frictional force between rests 41 and handle 50.

Figure 9:
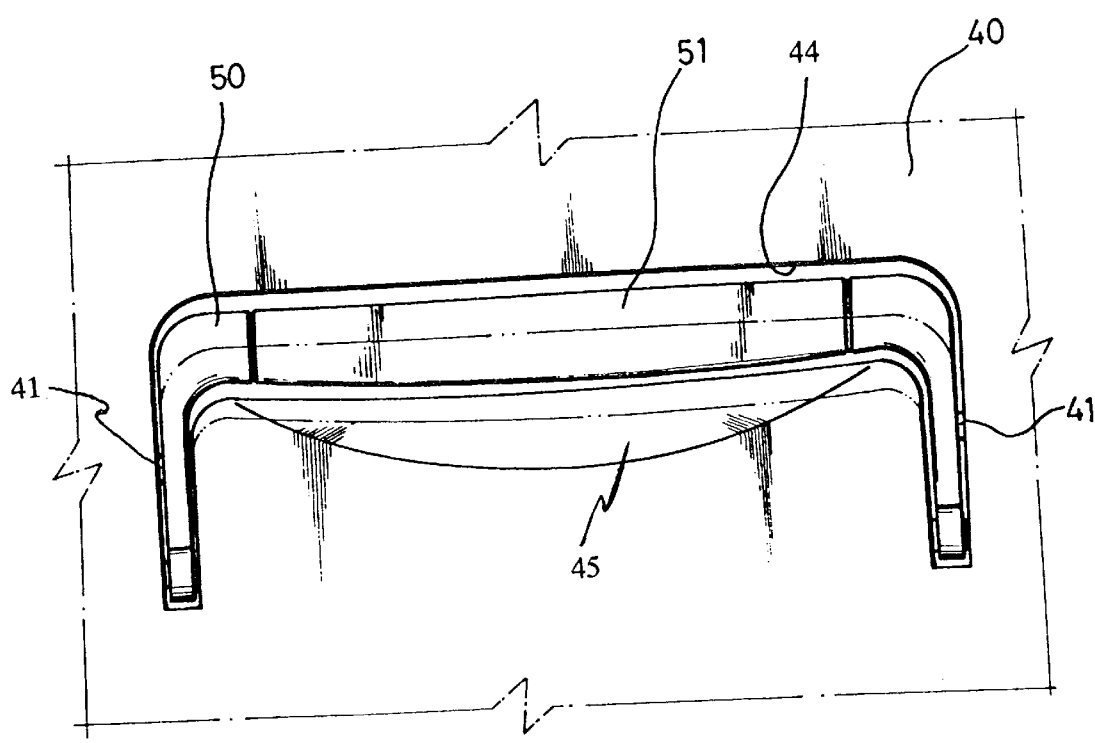
FIG. 9 is a top plan view illustrating a status of the handle, of the handle apparatus, that has been stopped by a rest in accordance with according to the principles of the invention.

Referring now to FIG. 9, handle 50 is shown in the stored position within groove 44 of cover 40. The frictional force between rests 41 and the rubber molding 51 of handle 50 is small so that only a minimum of effort need be employed when it is desired to raise handle 50 into its carrying position.

An assembling process of the handle apparatus for a computer according to the principles of the invention is as follows.

First, handle 50 is inserted through cover 40. Cover 40 is then connected to chassis 30, shafts 60 are then passed through holes 33 in flanges 34 and into holes 31 of tabs 32 and holes 52 of handle 50. However, it is also possible to attach cover 40 to chassis 30 before inserting handle 50.

A worker can confirm that shaft 60 is correctly positioned by sensing that the shaft 60 cannot be inserted any farther when grooved end 61 is stopped by stop rib 43 of the cover 40. When shaft 60 is correctly connected, groove 61' of shaft 60 mates with holder rib 42 of cover 40, thereby preventing the shaft 60 from coming loose.

Shaft 60 is supported by the hole 31 of the chassis 30, in addition, because the surface contact area between shaft 60 and hole 31 in tab 32 of chassis 30 is very large in contrast with the prior art. When the worker carries the computer, shaft 60 is prevented from being transformed by efficiently dispersing the load of the computer chassis 30 through the center of shaft 60.

A disassembling process is performed in a reverse sequence of the aforementioned assembling process, therefore additional description thereof is omitted.

An operation of the invention assembled as aforementioned process is described below.

When a user carries the computer, the user raises and grips the handle 50. In this case, rubber molding 51 is formed around handle 50, thereby minimizing the pressure affecting the hand of the user. After finishing transporting the computer. The user releases handle 50 and handle 50 freely falls. Handle 50, however, does not collided with cover 40 because it is stopped by the rest 41 formed in groove 44 of cover 40.

The handle apparatus for a computer is provided by the preferred embodiment of the invention, having the following effects: the invention is assembled or disassembled by a simple engaging method, not by a screw engaging method, thereby reducing a production expense; the contact region between a shaft and a chassis is enlarged in the invention, thereby preventing the transformation of the shaft; the invention includes a handle molded from rubber, thereby facilitating its gripping; and the invention employs a rest in the cover, thereby preventing its collision with the cover when released.

What is claimed is:

1. A housing for an electrical appliance, comprising:
   a handle having a predetermined shape, said handle having a mounting hole in each end thereof;
   a chassis forming a framework of said housing, a top portion of said chassis having two pairs of tabs each comprising a hole therein;
   a cover for covering said top portion of said chassis, said cover having a groove in which said handle is laid in a stored position, said groove having said predetermined shape;
   a pair of shafts each being insertable for a predetermined distance through said holes in respective ones of said tabs and through said mounting holes in said handle for attaching said handle to said chassis, said handle being pivotable around said shafts;
   stop ribs for preventing said shafts from being inserted farther than said predetermined distance; and
   holder ribs for engaging a groove in each of said shafts for securing each of said shafts in a corresponding desired position.

2. The housing as set forth in claim 1, each of said holes within said tabs comprising a large contact surface area for said shafts for dispersing said electrical appliance's load along said shafts to prevent said shafts from being transformed.

3. The housing as set forth in claim 1, said groove in said cover further comprising:
   at least one rest within said groove for stopping said handle at an acute angle when it falls from a carrying position towards said stored position to prevent said handle from colliding directly with said cover.

4. The housing as set forth in claim 1, said handle comprising a coating of rubber molding to facilitate a user's grip when carrying the electrical appliance.

5. The housing as set forth in claim 1, each said shaft comprising a plurality of handler grooves on one end thereof to facilitate the insertion and removal of said shaft.

6. The housing as set forth in claim 1, said cover comprising a bevel between a top surface portion of said cover and said groove in said cover to allow for easy access to said handle when it is desired to raise said handle from said stored position to a carrying position.

7. The housing as set forth in claim 6, said groove in said cover further comprising:
   at least one rest within said groove for stopping said handle at an acute angle when it falls from said carrying position towards said stored position.

8. The housing as set forth in claim 1, said top portion of said chassis comprising:
   a pair of flanges extending vertically upward; and
   a hole in each flange for allowing said shafts to be inserted and removed.

9. A housing for an electrical appliance, comprising:
   a handle having a U shape, said handle having a mounting hole in each end thereof;
   a chassis forming a framework of said housing, a top portion of said chassis having two pairs of vertically extended tabs each comprising a hole therein;
   a pair of shafts each being insertable a predetermined distance through said holes in respective ones of said tabs and through said mounting holes in said handle for attaching said handle to said chassis, said handle being pivotable around said shafts; and
   a cover for covering said top portion of said chassis, said cover comprising:
      a groove in an upper surface of said cover, each end of said handle being insertable through said groove to enable said mounting holes to be aligned with said holes in said tabs, said groove having an enlarged said U shape in which said handle is laid in a stored position;
      stop ribs extending vertically downward from said cover towards said chassis, said stop ribs preventing said shafts from being inserted farther than said predetermined distance; and
      holder ribs extending vertically downward from said cover towards said chassis, said holder ribs engaging a groove in each of said shafts for securing each of said shafts in a corresponding desired position.

10. The housing as set forth in claim 9, said cover comprising a bevel between said upper surface portion of said cover and said groove in said cover to allow for easy access to said handle when it is desired to raise said handle from said stored position to a carrying position.

11. The housing as set forth in claim 10, said groove in said cover further comprising:
   at least one rest within said groove for stopping said handle at an acute angle when it falls from said carrying position towards said stored position.

12. The housing as set forth in claim 9, each said shaft comprising a plurality of handler grooves on one end thereof to facilitate the insertion and removal of said shaft.

13. The housing as set forth in claim 9, said handle comprising a coating of rubber molding to facilitate a user's grip when carrying the electrical appliance.

14. The housing as set forth in claim 9, each of said holes within said tabs comprising a large contact surface area for said shafts for dispersing said electrical appliance's load along said shafts to prevent said shafts from being transformed.

15. A housing for an electrical appliance, comprising:

a handle having a predetermined shape, said handle having a mounting hole in each end thereof;

a chassis forming a framework of said housing, a top portion of said chassis having two pairs of tabs each comprising a hole therein;

a cover for covering said top portion of said chassis, said cover having a groove in which said handle is laid in a stored position, said groove having said predetermined shape;

at least one rest within said groove for stopping said handle at an acute angle when it falls from a carrying position towards said stored position to prevent said handle from colliding directly with said cover;

a pair of shafts each being insertable for a predetermined distance through said holes in respective ones of said tabs and through said mounting holes in said handle for attaching said handle to said chassis, said handle being pivotable around said shafts, each of said shafts having an annular groove formed in said shaft adjacent one end of said shaft;

stop ribs for preventing said shafts from being inserted farther than said predetermined distance; and holder ribs for engaging said annular grooves for securing each of said shafts in a desired position.

16. The housing as set forth in claim 15, each said shaft comprising a plurality of annular handler grooves adjacent a second end of each said shaft to facilitate the insertion and removal of said shaft.

17. The housing as set forth in claim 15, said cover comprising a bevel between a top surface portion of said cover and said groove in said cover to allow for easy access to said handle when it is desired to raise said handle from said stored position to a carrying position.

18. The housing as set forth in claim 15, each of said holes within said tabs comprising a large contact surface area for said shafts for dispersing said electrical appliance's load along said shafts to prevent said shafts from being transformed when said handle is used to carry said electrical appliance.

* * * * *